(12) United States Patent
Koyama

(10) Patent No.: US 9,437,462 B2
(45) Date of Patent: Sep. 6, 2016

(54) UNDERFILL MATERIAL AND METHOD FOR MANUFACTURING SEMICONDUCTOR DEVICE BY USING THE SAME

(71) Applicant: DEXERIALS CORPORATION, Tokyo (JP)

(72) Inventor: Taichi Koyama, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 34 days.

(21) Appl. No.: 14/547,660

(22) Filed: Nov. 19, 2014

(65) Prior Publication Data

US 2015/0079736 A1    Mar. 19, 2015

Related U.S. Application Data

(62) Division of application No. 13/770,289, filed on Feb. 19, 2013, now abandoned.

(30) Foreign Application Priority Data

Feb. 24, 2012   (JP) .................................. 2012-038482

(51) Int. Cl.

| | |
|---|---|
| *C08L 53/00* | (2006.01) |
| *C08L 63/00* | (2006.01) |
| *C08L 63/02* | (2006.01) |
| *H01L 21/56* | (2006.01) |
| *C08L 33/08* | (2006.01) |
| *C08L 33/10* | (2006.01) |
| *C08L 29/02* | (2006.01) |
| *C08L 29/14* | (2006.01) |
| *C08L 75/04* | (2006.01) |
| *C08L 75/06* | (2006.01) |
| *C08L 75/08* | (2006.01) |
| *C08L 67/02* | (2006.01) |
| *C08G 59/42* | (2006.01) |
| *H01L 23/29* | (2006.01) |
| *H01L 23/00* | (2006.01) |

(52) U.S. Cl.
CPC ............. *H01L 21/563* (2013.01); *C08G 59/42* (2013.01); *C08L 29/02* (2013.01); *C08L 29/14* (2013.01); *C08L 33/08* (2013.01); *C08L 33/10* (2013.01); *C08L 53/00* (2013.01); *C08L 63/00* (2013.01); *C08L 67/02* (2013.01); *C08L 75/04* (2013.01); *C08L 75/06* (2013.01); *C08L 75/08* (2013.01); *H01L 21/56* (2013.01); *H01L 23/293* (2013.01); *H01L 24/81* (2013.01); *C08G 2261/126* (2013.01); *H01L 2224/81091* (2013.01); *H01L 2224/81815* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 4,388,448 A | * | 6/1983 | Melby ..................... | C08F 20/32 525/327.3 |
| 2006/0154078 A1 | | 7/2006 | Watanabe et al. | |
| 2010/0151155 A1 | | 6/2010 | Kwak et al. | |
| 2010/0286351 A1 | * | 11/2010 | Yoshida ................ | C08F 297/00 526/209 |
| 2011/0003947 A1 | * | 1/2011 | Kishi ................... | C08F 297/026 525/92 H |
| 2011/0172349 A1 | * | 7/2011 | Ito .......................... | C08F 297/00 524/529 |
| 2011/0291260 A1 | | 12/2011 | Honda et al. | |

FOREIGN PATENT DOCUMENTS

| | | | |
|---|---|---|---|
| JP | 2009-239138 A | * | 10/2009 |
| JP | A-2009-239138 | | 10/2009 |
| JP | 2010-222390 A | * | 10/2010 |
| JP | 2011-14717 A | * | 1/2011 |
| JP | A-2011-014717 | | 1/2011 |
| WO | WO 2009/008252 A1 | * | 1/2009 ............ C08F 297/00 |

* cited by examiner

*Primary Examiner* — Robert Sellers
(74) *Attorney, Agent, or Firm* — Oliff PLC

(57) ABSTRACT

A method for manufacturing a semiconductor device by using underfill material includes: a semiconductor chip mounting step configured to mount a semiconductor chip having a solder bump on a substrate via an underfill film including a film forming resin having a weight average molecular weight of not more than 30000 g/mol and a molecular weight distribution of not more than 2.0, an epoxy resin, and an epoxy curing agent; and a reflow step configured to solder-bond the semiconductor chip and the substrate by a reflow furnace. The film forming resin of the underfill material has a weight average molecular weight of not more than 30000 g/mol and a molecular weight distribution of not more than 2.0, and accordingly, the viscosity at the time of heat melting can be reduced, and a semiconductor chip can be mounted at a low pressure.

5 Claims, 5 Drawing Sheets

UNDERFILL MATERIAL AND METHOD FOR MANUFACTURING SEMICONDUCTOR DEVICE BY USING THE SAME

RELATED APPLICATIONS

This application is a division of application Ser. No. 13/770,289 (now abandoned) filed Feb. 19, 2013, which claims priority to Japanese Patent Application No. 2012-038482 filed Feb. 24, 2012. The disclosures of these applications are incorporated herein by reference in their entireties.

BACKGROUND OF THE INVENTION

1. Field of the Invention

The present invention relates to an underfill material used for mounting semiconductors, and a method for manufacturing a semiconductor device by using the underfill material.

2. Description of the Related Art

In recent years, in a method of mounting a semiconductor chip to a substrate, a use of an "pre-provided underfill film" has been considered in order to shorten a step, the use of the pre-provided underfill film being such that, before metal bonding or pressure welding bonding of a semiconductor IC (Integrated Circuit) electrode and a substrate electrode, an underfill film is stuck on a substrate.

The mounting method using this pre-provided underfill film is performed, for example, as follows (For example, refer to Japanese Patent Application Laid-Open No. 2009-239138 and Japanese Patent Application Laid-Open No. 2011-014717.).

Step A: An underfill film is stuck on a wafer, and then dicing is carried out to obtain a semiconductor chip.

Step B: The semiconductor chip is aligned on a substrate.

Step C: The semiconductor chip and the substrate are pressure-bonded at a high temperature and a high pressure to secure electrical connection by solder bump metal bonding and to bond the semiconductor chip and the substrate together by curing of the underfill film.

However, according to the above-mentioned mounting method, in the step C, since a semiconductor chip and a substrate need to be pressure-bonded at a relatively high pressure, there is a risk of damage to the semiconductor chip.

The present invention is proposed to solve the above-mentioned conventional problem, and provides an underfill material which enables a semiconductor chip to be mounted at a low pressure, and a method for manufacturing a semiconductor device by using the underfill material.

SUMMARY OF THE INVENTION

In order to solve the above-mentioned problem, an underfill material according to the present invention comprises: a film forming resin having a weight average molecular weight of not more than 30000 g/mol and a molecular weight distribution of not more than 2.0; an epoxy resin; and an epoxy curing agent.

Furthermore, a method for manufacturing a semiconductor device according to the present invention comprises: a semiconductor chip mounting step configured to mount a semiconductor chip having a solder bump on a substrate via an underfill film including a film forming resin having a weight average molecular weight of not more than 30000 g/mol and a molecular weight distribution of not more than 2.0, an epoxy resin, and an epoxy curing agent; and a reflow step configured to solder-bond the semiconductor chip and the substrate by a reflow furnace.

In the present invention, since the film forming resin included in the underfill material has a weight average molecular weight of not more than 30000 g/mol and a molecular weight distribution of not more than 2.0, the viscosity at the time of heat melting can be reduced, and a semiconductor chip can be mounted at a low pressure.

DETAILED DESCRIPTION OF THE PREFERRED EMBODIMENTS

Figure 1:
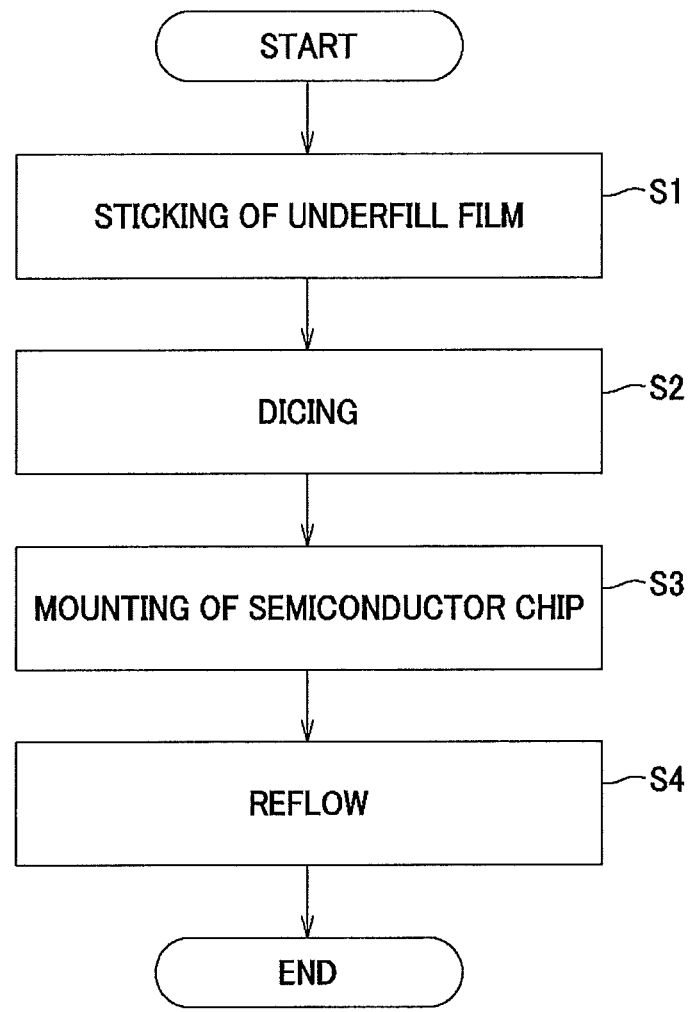
FIG. 1 is a flow chart illustrating a method for manufacturing a semiconductor device according to the present embodiment.

Hereinafter, an embodiment according to the present invention will be described in detail in the following order.
1. Underfill Material
2. Method for Manufacturing Semiconductor Device
3. Examples

1. Underfill Material

An underfill material according to the present embodiment comprises a film forming resin, an epoxy resin, and an epoxy curing agent.

The film forming resin has a weight average molecular weight Mw of preferably not less than 5000 g/mol and not more than 30000 g/mol, more preferably not less than 10000 g/mol and not more than 25000 g/mol. When the weight average molecular weight Mw exceeds 30000 g/mol, the minimum melt viscosity becomes high, whereby it is difficult to mount a semiconductor chip at a low pressure. On the other hand, when the weight average molecular weight Mw is too low, the film forming property is worsened.

Furthermore, the film forming resin has a molecular weight distribution (Mw/Mn) of not more than 2.0, the molecular weight distribution (Mw/Mn) being represented by a ratio of a weight average molecular weight Mw to a number average molecular weight Mn. When the molecular weight distribution exceeds 2.0, it becomes difficult to obtain a low minimum melt viscosity. A resin having such a narrow molecular weight distribution can be obtained by, for example, living polymerization. Furthermore, a resin having a narrow molecular weight distribution can be obtained also by, for example, a common technique, such as adjusting a kind or an amount of a catalyst.

The film forming resin is not particularly limited as long as the above-mentioned physical properties are satisfied, and, for example, various resins, such as polyvinyl phenol resin, phenoxy resin, polyester urethane resin, polyester resin, polyurethane resin, acrylate resin, polyimide resin, and butyral resin, may be used. These film forming resins may be used alone, or two or more kinds of these may be used in combination.

Among these, from viewpoints of film formation state, connection reliability, and the like, polyvinyl phenol resin is preferably used. Examples of the polyvinyl phenol resin include a tri-block copolymer obtained by living cationic polymerization of p-hydroxystyrene (PHS) and ethyl vinyl ether (EVE).

In the case where a copolymer of p-hydroxystyrene (PHS) and ethyl vinyl ether (EVE) is used, a composition ratio thereof (PHS/EVA) is preferably not less than 20/80 and not more than 70/30, more preferably not less than 30/70 and not more than 50/50. Since p-hydroxystyrene functions also as an epoxy curing agent, an amount of an epoxy curing agent blended can be adjusted.

When an amount of the film forming resin used is too small, a film tends not to be formed, on the other hand, when an amount thereof is too much, a resin removal property for obtaining electric connection tends to be low, and therefore, an amount of the film forming resin used is preferably 30 to 80% by mass of a resin solid content (a total of a film forming resin and an epoxy resin), more preferably 40 to 70% by mass.

Examples of the epoxy resin include glycidyl ether type epoxy resin, such as tetrakis(glycidyloxyphenyl)ethane and tris(glycidyloxyphenyl)methane, glycidyl amine type epoxy resin, such as tetraglycidyl diaminodiphenylmethane, bisphenol A type epoxy resin, bisphenol F type epoxy resin, bisphenol S type epoxy resin, spirocyclic epoxy resin, naphthalene type epoxy resin, biphenyl type epoxy resin, terpene type epoxy resin, tetrabromobisphenol A type epoxy resin, cresol novolak type epoxy resin, phenol novolak type epoxy resin, α-naphthol novolak type epoxy resin, and brominated phenol novolak type epoxy resin. These epoxy resins may be used alone, or two or more kinds of these may be used in combination. Among these, from viewpoints of high adhesiveness and heat resistance, glycidyl ether type epoxy resin is preferably used.

The epoxy curing agent is not particularly limited, but, in the case where solder is used for an electrode, an acid anhydride having a flux function to remove an oxide film on a surface of the solder is preferably used as an epoxy curing agent. Examples of the acid anhydride curing agent include aliphatic acid anhydride, such as tetrapropenyl succinic anhydride and dodecenyl succinic anhydride; alicyclic acid anhydride, such as hexahydrophthalic anhydride and methyltetrahydrophthalic anhydride; and aromatic acid anhydride, such as phthalic anhydride, trimellitic anhydride, and pyromellitic anhydride. These epoxy curing agents may be used alone, or two or more kinds of these may be used in combination. Among these epoxy curing agents, from a viewpoint of solder connection property, aliphatic acid anhydride is preferably used.

An effective curing amount of the epoxy curing agent is blended. When an amount of the epoxy curing agent used is too small, solder wetting tends to be insufficient, on the other hand, when an amount thereof is too large, the preservation stability tends to be decreased. In the case where aliphatic acid anhydride is used as an epoxy curing agent, not less than 15 parts by mass and not more than 90 parts by mass of the aliphatic acid anhydride with respect to 100 parts by mass of an epoxy resin is preferable, and not less than 40 parts by mass and not more than 70 parts by mass thereof is more preferable.

Furthermore, a curing accelerator may be contained as needed. Specific examples of the curing accelerator include tertiary amines, such as 1,8-diazabicyclo(5,4,0)undecene-7 salt (DBU salt) and 2-(dimethylaminomethyl)phenol; imidazoles, such as 2-methylimidazole, 2-ethylimidazole, and 2-ethyl-4-methylimidazole; phosphines, such as triphenylphosphine; and metallic compounds, such as octyl tin. Furthermore, 0.1 to 5.0 parts by mass of the curing accelerator with respect to 100 parts by weight of an epoxy resin are blended as needed.

Furthermore, various compounding agents, such as a filler, for example, silica, alumina, glass fiber, and talc; a mold release; a pigment; a surface treatment agent; a viscosity modifier; a plasticizer; a stabilizer; and a coupling agent, may be blended as needed.

The underfill material having such composition comprises a film forming resin having a weight average molecular weight of not more than 30000 g/mol and a molecular weight distribution of not more than 2.0, and accordingly, the viscosity at the time of heat melting can be reduced, and a semiconductor chip can be mounted at a low pressure. Also, acid anhydride is used as an epoxy curing agent, whereby a flux function to remove an oxide film on a surface of solder can be provided. Also, as the film forming resin, a tri-block copolymer of p-hydroxystyrene and ethyl vinyl ether, which functions also as an epoxy curing agent, is used, whereby an amount of an epoxy curing agent blended can be adjusted.

Next, a method for manufacturing the above-mentioned underfill material will be explained. Here, there is explained a method for manufacturing an underfill film in which an underfill material is formed in a film shape. The method for manufacturing the underfill film comprises: an application step of applying a composite onto a release base material, the composite including a film forming resin having a weight average molecular weight of not more than 30000 g/mol and a molecular weight distribution of not more than 2.0, an epoxy resin, and an epoxy curing agent; and a drying step of drying the composite on the release base material.

In the application step, the composite, which comprises the film forming resin, the epoxy resin, and the epoxy curing agent and is adjusted so as to have the above-mentioned composition, is applied on a release base material by using a bar coater, an application apparatus, or the like. The release base material has a lamination structure, for example, configured such that a release agent, such as silicone, is applied to PET (Poly Ethylene Terephthalate), OPP (Oriented Polypropylene), PMP (Poly-4-methlpentene-1), PTFE (Polytetrafluoroethylene), or the like, whereby the composite is prevented from drying and also a shape of the composite is maintained. The composite is dissolved in an organic solvent and obtained. As the organic solvent, toluene, ethyl acetate, a mixed solvent obtained by mixing toluene with ethyl acetate, or other various organic solvents may be used.

In the subsequent drying step, the composite on the release base material is dried by a heat oven, a heat-drying apparatus, or the like. Thus, there can be obtained the underfill film comprising a film forming resin having a weight average molecular weight of not more than 30000 g/mol and a molecular weight distribution of not more than 2.0, an epoxy resin, and an epoxy curing agent.

2. Method for Manufacturing Semiconductor Device

Next, a method for manufacturing a semiconductor device by using the above-mentioned underfill film will be explained.

FIG. 1 is a flow chart illustrating a method for manufacturing a semiconductor device according to the present embodiment. As shown in FIG. 1, a method for manufacturing a semiconductor device according to the present embodiment comprises an underfill film sticking step S1, a dicing step S2, a semiconductor chip mounting step S3, and a reflow step S4.

Figure 2:
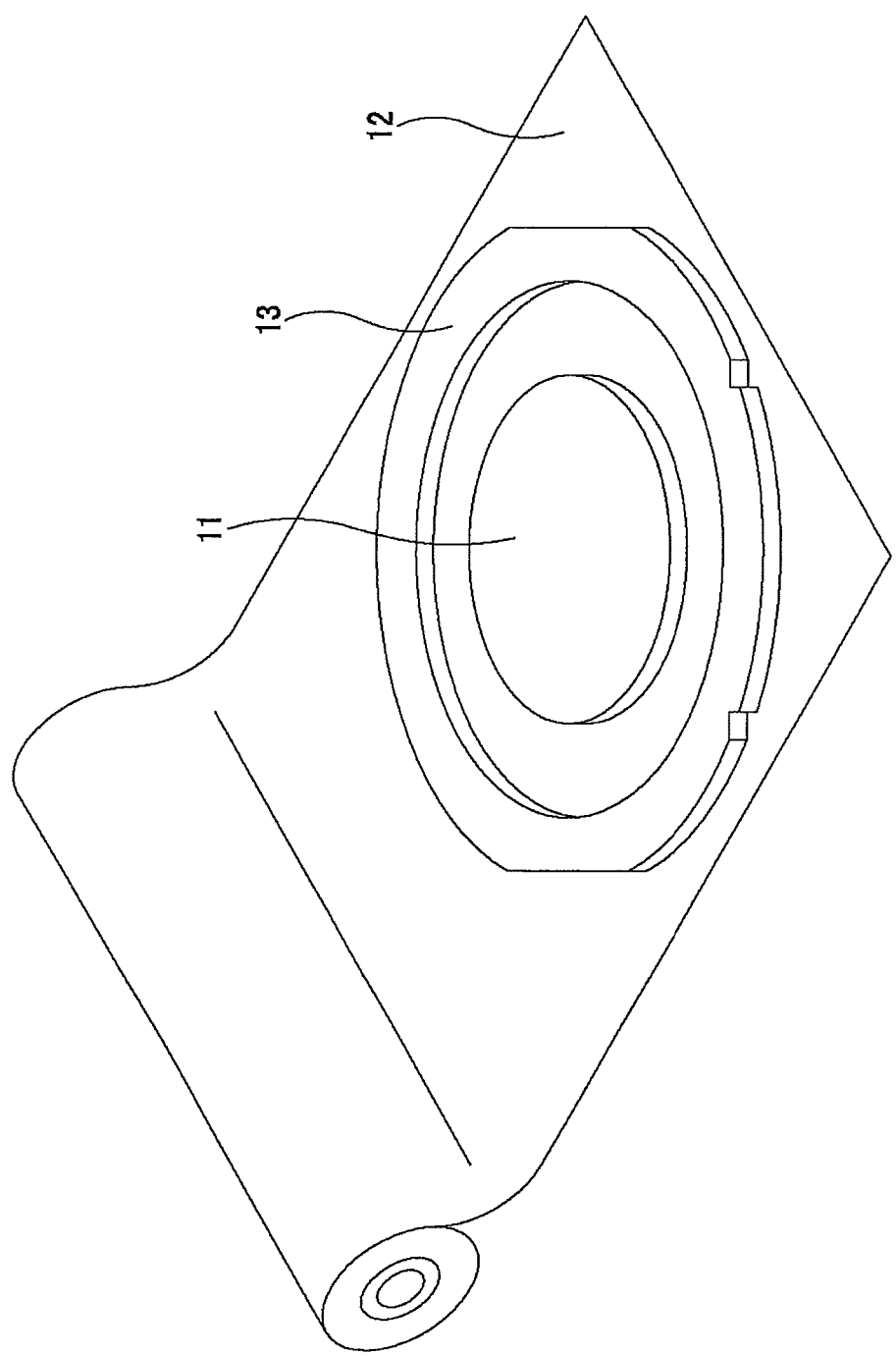
FIG. 2 is a perspective view schematically illustrating a step of sticking an underfill film on a wafer.

FIG. 2 is a perspective view schematically illustrating a step of sticking an underfill film on a wafer. As shown in FIG. 2, in the underfill film sticking step S1, a wafer 11 is fixed by a jig 13 having a frame in a ring or rectangular shape with a larger diameter than a diameter of the wafer 11, and an underfill film 12 is stuck on the wafer 11. The underfill film 12 functions as a dicing tape to protect and fix the wafer 11 at the time of dicing of the wafer 11 and to hold the wafer 11 at the time of picking-up. Note that many ICs (Integrated Circuits) are made in the wafer 11, and, on an adhesion face of the wafer 11, a solder bump is prepared every semiconductor chip divided by scribe lines.

Figure 3:
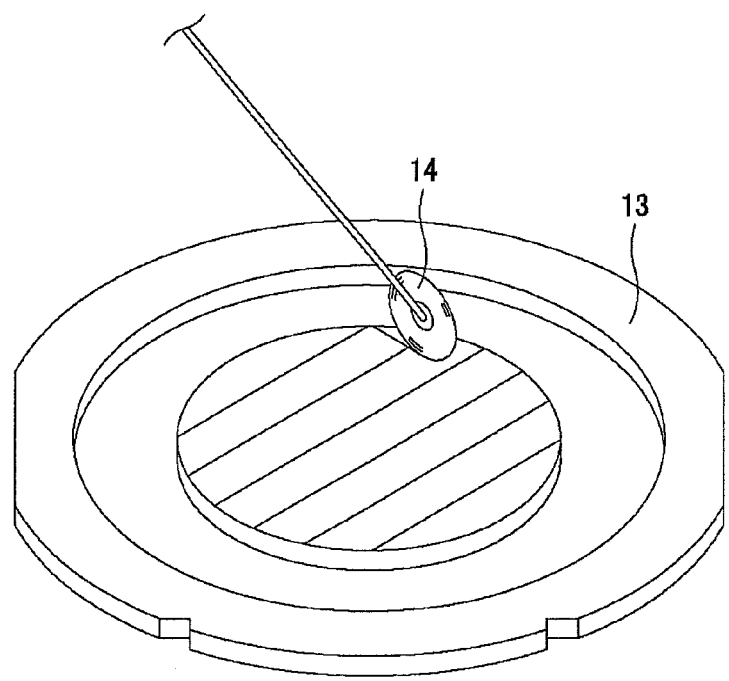
FIG. 3 is a perspective view schematically illustrating a step of dicing the wafer.

FIG. 3 is a perspective view schematically illustrating a step of dicing a wafer. As shown in FIG. 3, in the dicing step S2, the wafer 11 is cut by pressing a blade 14 along scribe lines, and thereby divided into independent semiconductor chips.

Figure 4:
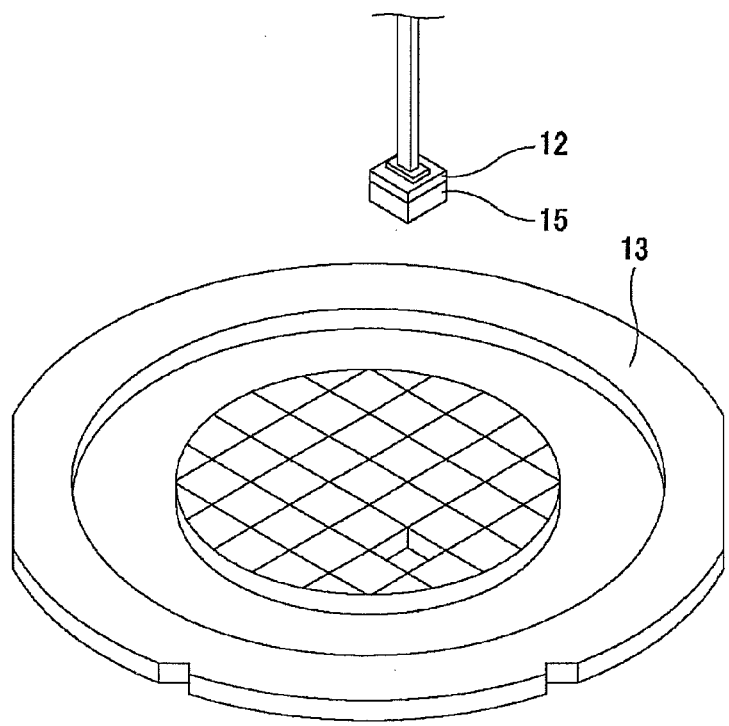
FIG. 4 is a perspective view schematically illustrating a step of picking up a semiconductor chip.

FIG. 4 is a perspective view schematically illustrating a step of picking up a semiconductor chip. As shown in FIG. 4, each semiconductor chip 15 with the underfill film 12 is held by the underfill film 12 and picked up.

Figure 5:
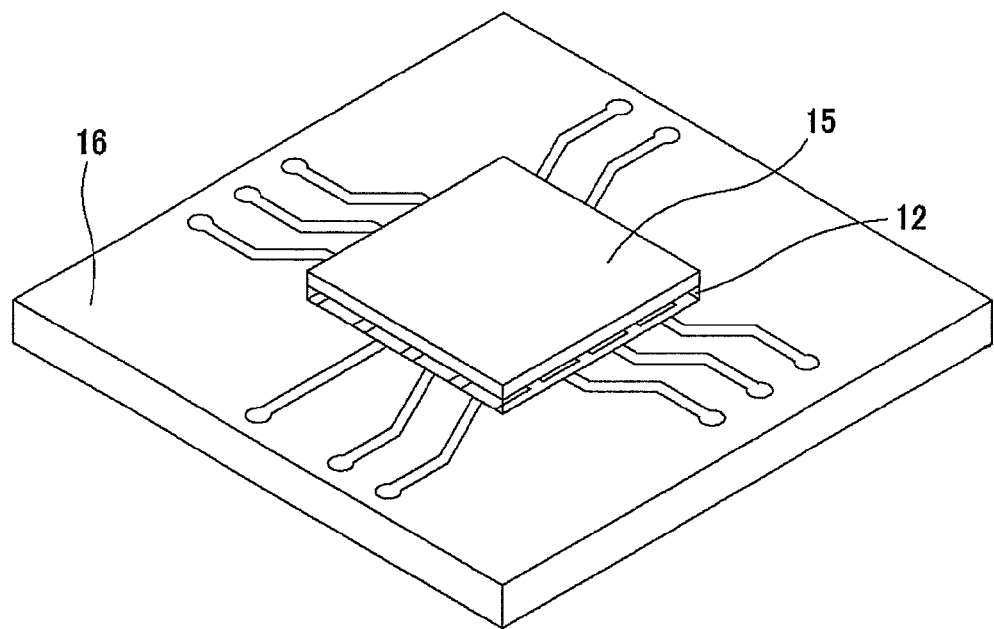
FIG. 5 is a perspective view schematically illustrating a step of mounting the semiconductor chip on a substrate.

FIG. 5 is a perspective view schematically illustrating a step of mounting a semiconductor chip on a substrate. A substrate 16 is, for example, a rigid substrate or a flexible substrate, and an electrode to be electrically connected with a solder bump of the semiconductor chip 15 is formed in a mounting portion on which the semiconductor chip 15 is to be mounted.

As shown in FIG. 5, in the semiconductor chip mounting step S3, the semiconductor chip 15 with the underfill film 12 and the substrate 16 are disposed via the underfill film 12. Furthermore, the semiconductor chip 15 with the underfill film 12 is positioned and disposed so as to make a solder bump and a substrate electrode face each other.

Then, the underfill film 12 is heat-pressed to be temporarily fixed under predetermined conditions of temperature, pressure, and time, having a degree in which a flowability is produced by a thermal bonder while full curing is not caused. The temperature condition at the time of the temporal fixing is preferably not less than 60 degrees C. and not more than 150 degrees C., more preferably not less than 80 degrees C. and not more than 120 degrees C. The pressure condition is preferably not more than 10 N, more preferably not more than 8 N. The time condition is preferably not less than 1 second and not more than 120 seconds, more preferably not less than 5 seconds and not more than 60 seconds. Thus, it is made possible that, without melting, the solder bump is maintained in contact with the electrode at a side of the substrate 16, and the underfill film 12 is not completely cured. Furthermore, since the temporal fixing is performed at a low temperature, generation of a void is controlled, and damage to the semiconductor chip 15 can be reduced.

In the subsequent reflow step S4, the solder bump is melted by intense heat from a reflow furnace, whereby a metallic bond is formed and the underfill film 12 is completely cured. A temperature condition at the time of reflow, although depending on a kind of the solder, is preferably not less than 200 degrees C. and not more than 280 degrees C., more preferably not less than 240 degrees C. and not more than 260 degrees C. Furthermore, a time condition is preferably not less than 5 seconds and not more than 500 seconds, more preferably not less than 10 seconds and not more than 100 seconds. Thus, a metallic bond of the solder bump and the substrate electrode is formed and the underfill film 12 is completely cured, whereby an electrode of the semiconductor chip 15 and the electrode of the substrate 16 can be electrically and mechanically connected.

As mentioned above, the method of manufacturing a semiconductor device according to the present embodiment comprises: the semiconductor chip mounting step S3 configured to mount the semiconductor chip 15 having a solder bump on the substrate 16 via the underfill film 12 including a film forming resin having a weight average molecular weight of not more than 30000 g/mol and a molecular weight distribution of not more than 2.0, an epoxy resin, and an epoxy curing agent; and the reflow step S4 configured to solder-bond the semiconductor chip 15 and the substrate 16 by a reflow furnace, whereby the semiconductor chip 15 is mounted at a relatively low pressure, and therefore damage to the semiconductor chip 15 can be reduced.

Note that, in the above-mentioned embodiment, the underfill film is made to function as a dicing tape, but is not limited to this, and, by using a dicing tape independently, after dicing, flip-chip mounting may be performed using the underfill film.

Examples

3. Examples

Hereinafter, Examples of the present invention will be described. In the Examples, a tri-block copolymer obtained by living cationic polymerization of p-hydroxystyrene (PHS) and ethyl vinyl ether (EVE) was blended to produce a pre-provided underfill film. Then, by using this underfill film, a semiconductor chip was mounted on a substrate.

Here, there were evaluated the minimum melt viscosity of the underfill film, the minimum mounting pressure of a mounting body, solder connection state, presence and absence of a crack or a warp, and presence and absence of a void. Note that the present invention is not limited to these Examples.

[Evaluation Method]
(Minimum Melt Viscosity)

The minimum melt viscosity of a sample was measured by using a rheometer (ARES manufactured by TA instruments) under conditions of 5 degrees C./min and 1 Hz.

(Minimum Mounting Pressure)

As a minimum mounting pressure (N), there was set a minimum set pressure capable of pressure-bonding the sample with changing a set pressure of a flip chip bonder (FCB3 manufactured by Panasonic Factory Solutions Co., Ltd.) and thereby making a solder bump being in contact with an electrode at a side of a substrate.

(Solder Connection State)

Figure 6:
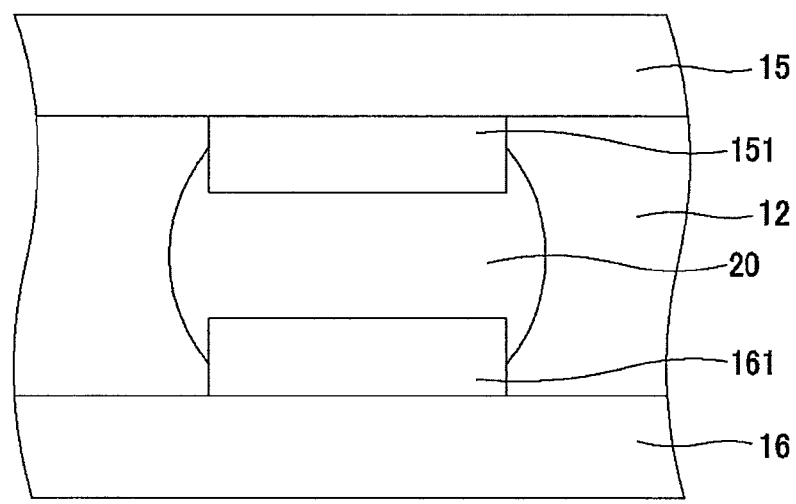
FIG. 6 is a cross-sectional diagram illustrating a state of good solder connection and good solder wetting.
Figure 7:
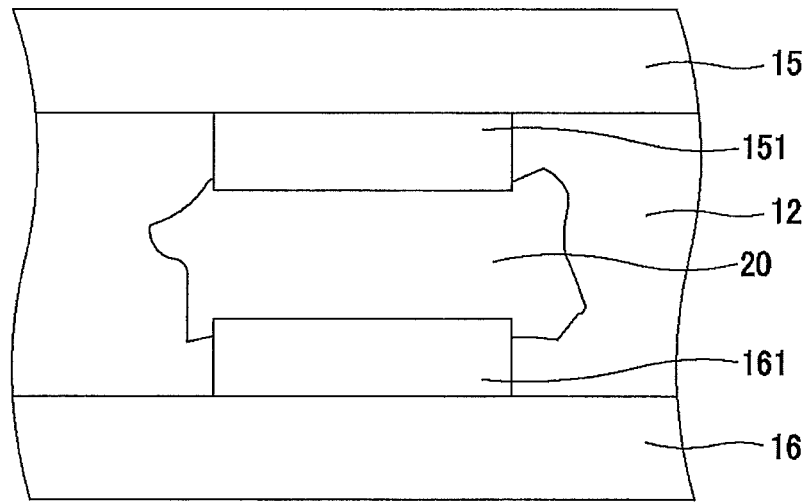
FIG. 7 is a cross-sectional diagram illustrating a state of good solder connection and insufficient solder wetting.
Figure 8:
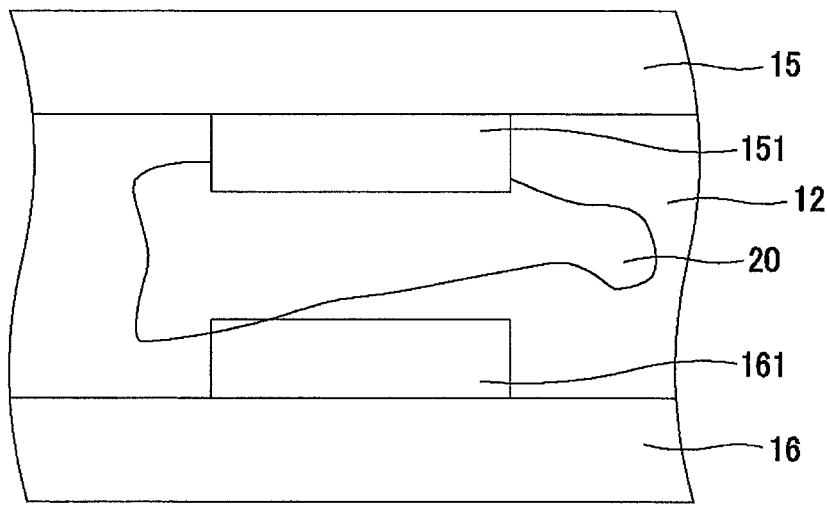
FIG. 8 is a cross-sectional diagram illustrating a state of insufficient solder connection and insufficient solder. wetting.

The sample was cut, and a cross-section thereof was polished, and, as shown in the cross-section diagrams illustrated in FIG. 6 to FIG. 8, a state of a solder 20 between an electrode 151 of the semiconductor chip 15 and an electrode 161 of the substrate 16 after curing the underfill film 12 was observed by SEM (Scanning Electron Microscope). As shown in FIG. 6, a state of good solder connection and good solder wetting was represented as ⊚. As shown in FIG. 7, a state of good solder connection and insufficient solder wetting was represented as ○. As shown in FIG. 8, a state of insufficient solder connection and insufficient solder wetting was represented as x.

(Presence and Absence of Crack or Warp)

The sample was visually observed using a microscope; and when either a crack or a warp of the sample was generated, such state was represented as "Presence", while when neither a crack nor a warp of the sample was generated, such state was represented as "Absence". Note that, generally, generation of a warp increases a possibility of having a bad influence on long-term reliability.

(Presence and Absence of Void)

The sample was observed using SAT (Scanning Acoustic Tomograph, ultrasonic imaging device), and when a void was generated, such state was represented as "Presence", while when a void was not generated, such state was represented as "Absence". Note that, generally, generation of a void increases a possibility of having a bad influence on long-term reliability.

Example 1

An underfill film was produced as follows. Using a solvent having a ratio of toluene to ethyl acetate of 50/50 wt %, 70 parts by mass of a film forming resin, 40 parts by mass of a curing agent, and 2 parts by mass of a curing catalyst with respect to 100 parts by mass of an epoxy resin were blended to produce an epoxy resin composite.

As the film forming resin, there was used a tri-block copolymer obtained by living cationic polymerization of p-hydroxystyrene (PHS) and ethyl vinyl ether (EVE). Specifically, MARUKA LYNCUR TB (PHS/EVE=50/50) manufactured by Maruzen Petrochemical Co., Ltd. and having a composition ratio of PHS to EVE of 50/50, a weight average molecular weight Mw of 20000 g/mol, and a molecular weight distribution (Mw/Mn) of 1.8 was used. Furthermore, JER 1031S manufactured by Mitsubishi Chemical Corporation, RIKACID DDSA manufactured by New Japan Chemical Co., Ltd., and U-CAT5002 manufactured by San-Apro Ltd. were used as the epoxy resin, the curing agent, and the curing catalyst, respectively.

This epoxy resin composite was applied onto a siliconized PET (Polyethylene Terephthalate) film, by using a bar coater, and then, dried by blowing hot air having a temperature of 80 degrees C. for 5 minutes, whereby an underfill film having a thickness of 30 μm was produced.

The above-mentioned underfill film was stuck on a wafer, and diced to obtain a semiconductor chip. Under a condition of a temperature of 100 degrees C., while a pressure was applied as the minimum mounting pressure until a solder bump of the semiconductor chip made a contact with a bump at a side of the substrate, pressure bonding was performed for 10 seconds, whereby the semiconductor was mounted. Then, through a reflow furnace having a maximum temperature of 260 degrees C., the semiconductor chip and the substrate were solder-connected.

Table 1 shows evaluation results of the underfill film and the mounting body of Example 1. It was found that the minimum melt viscosity of the underfill film of Example 1 was less than 15.0 Pa·S, hence the underfill film of Example 1 had excellent flowability. Also, it was found that the minimum mounting pressure at the time of semiconductor mounting was less than 10.0 N, hence mounting at a low pressure was possible. Also, the mounting body of Example 1 had a state of good solder connection and good solder wetting, and furthermore, neither a crack nor a warp was generated, and no void was generated.

Example 2

An underfill film was produced and a mounting body was produced in the same manner as in Example 1, except that 70 parts by mass of a curing agent with respect to 100 parts by mass of an epoxy resin were blended, and MARUKA LYNCUR TB (PHS/EVE=30/70) manufactured by Maruzen Petrochemical Co., Ltd. and having a composition ratio of PHS to EVE of 30/70, a weight average molecular weight Mw of 20000 g/mol, and a molecular weight distribution (Mw/Mn) of 1.8 was used as a film forming resin.

Table 1 shows evaluation results of the underfill film and the mounting body of Example 2. It was found that the minimum melt viscosity of the underfill film of Example 2 was less than 15.0 Pa·S, hence the underfill film of Example 2 had excellent flowability. Also, it was found that the minimum mounting pressure at the time of semiconductor mounting was less than 10.0 N, hence mounting at a low pressure was possible. Also, the mounting body of Example 2 had a state of good solder connection and good solder wetting, and furthermore, neither a crack nor a warp was generated, and no void was generated.

Example 3

An underfill film was produced and a mounting body was produced in the same manner as in Example 1, except that 100 parts by mass of a film forming resin with respect to 100 parts by mass of an epoxy resin were blended, and MARUKA LYNCUR TB (PHS/EVE=30/70) manufactured by Maruzen Petrochemical Co., Ltd. and having a composition ratio of PHS to EVE of 30/70, a weight average molecular weight Mw of 20000 g/mol, and a molecular weight distribution (Mw/Mn) of 1.8 was used as the film forming resin.

Table 1 shows evaluation results of the underfill film and the mounting body of Example 3. It was found that the minimum melt viscosity of the underfill film of Example 3 was less than 15.0 Pa·S, hence the underfill film of Example 3 had excellent flowability. Also, it was found that the minimum mounting pressure at the time of semiconductor mounting was less than 10.0 N, hence mounting at a low pressure was possible. Also, the mounting body of Example 3 had a state of good solder connection and good solder wetting, and furthermore, neither a crack nor a warp was generated, and no void was generated.

Example 4

An underfill film was produced and a mounting body was produced in the same manner as in Example 1, except that 15 parts by mass of a curing agent with respect to 100 parts by mass of an epoxy resin were blended, and MARUKA LYNCUR TB (PHS/EVE=70/30) manufactured by Maruzen Petrochemical Co., Ltd. and having a composition ratio of PHS to EVE of 70/30, a weight average molecular weight Mw of 20000 g/mol, and a molecular weight distribution (Mw/Mn) of 1.8 was used as the film forming resin.

Table 1 shows evaluation results of the underfill film and the mounting body of Example 4. It was found that the minimum melt viscosity of the underfill film of Example 4 was less than 15.0 Pa·S, hence the underfill film of Example 4 had excellent flowability. Also, it was found that the minimum mounting pressure at the time of semiconductor mounting was less than 10.0 N, hence mounting at a low pressure was possible. Also, the mounting body of Example 4 had a state of good solder connection and insufficient solder wetting. Also, in the mounting body of Example 4, neither a crack nor a warp was generated, and no void was generated.

Example 5

An underfill film was produced and a mounting body was produced in the same manner as in Example 1, except that 90 parts by mass of a curing agent with respect to 100 parts by mass of an epoxy resin were blended, and MARUKA LYNCUR TB (PHS/EVE=20/80) manufactured by Maruzen Petrochemical Co., Ltd. and having a composition ratio of PHS to EVE of 20/80, a weight average molecular weight Mw of 20000 g/mol, and a molecular weight distribution (Mw/Mn) of 1.8 was used as the film forming resin.

Table 1 shows evaluation results of the underfill film and the mounting body of Example 5. It was found that the minimum melt viscosity of the underfill film of Example 5 was less than 15.0 Pa·S, hence the underfill film of Example 5 had excellent flowability. Also, it was found that the minimum mounting pressure at the time of semiconductor mounting was less than 10.0 N, hence mounting at a low pressure was possible. Also, the mounting body of Example 5 had a state of good solder connection and insufficient solder wetting. Also, in the mounting body of Example 5, neither a crack nor a warp was generated, and no void was generated.

Comparative Example 1

An underfill film was produced and a mounting body was produced in the same manner as in Example 1, except that 30 parts by mass of PHENOLITE TD2131 manufactured by DIC Corporation and 60 parts by mass of RIKACID DDSA manufactured by New Japan Chemical Co., Ltd. with respect to 100 parts by mass of an epoxy resin were blended as curing agents; and Phenotohto YP50 manufactured by Nippon Steel Chemical Co., Ltd. and having a weight average molecular weight Mw of 50000 g/mol, and a molecular weight distribution (Mw/Mn) of 3.5 was used as a film forming resin.

Table 1 shows evaluation results of the underfill film and the mounting body of Comparative Example 1. It was found that the minimum melt viscosity of the underfill film of Comparative Example 1 was more than 15.0 Pa·S, hence the underfill film of Comparative Example 1 had insufficient flowability. Also, it was found that the minimum mounting pressure at the time of semiconductor mounting was more than 10.0 N, hence a high pressure was required for the semiconductor mounting. Also, the mounting body of Comparative Example 1 had a state of insufficient solder connection and insufficient solder wetting, and generation of a crack or a warp and generation of a void were observed.

Comparative Example 2

An underfill film was produced and a mounting body was produced in the same manner as in Example 1, except that 30 parts by mass of PHENOLITE TD2131 manufactured by DIC Corporation and 60 parts by mass of RIKACID DDSA manufactured by New Japan Chemical Co., Ltd. with respect to 100 parts by mass of an epoxy resin were blended as curing agents; and Teisan Resin SG-P3 manufactured by Nagase Chemtex Corporation and having a weight average molecular weight Mw of 850000 g/mol, and a molecular weight distribution (Mw/Mn) of 3.4 was used as a film forming resin.

Table 1 shows evaluation results of the underfill film and the mounting body of Comparative Example 2. It was found that the minimum melt viscosity of the underfill film of Comparative Example 2 was more than 15.0 Pa·S, hence the underfill film of Comparative Example 2 had insufficient flowability. Also, it was found that the minimum mounting pressure at the time of semiconductor mounting was more than 10.0 N, hence a high pressure was required for the semiconductor mounting. Also, the mounting body of Comparative Example 2 had a state of insufficient solder connection and insufficient solder wetting, and generation of a crack or a warp and generation of a void were observed.

Comparative Example 3

An underfill film was produced and a mounting body was produced in the same manner as in Example 1, except that MARUKA LYNCUR TB (PHS/EVE=50/50) manufactured by Maruzen Petrochemical Co., Ltd. and having a composition ratio of PHS to EVE of 50/50, a weight average molecular weight Mw of 20000 g/mol, and a molecular weight distribution (Mw/Mn) of 3.0 was used as a film forming resin.

Table 1 shows evaluation results of the underfill film and the mounting body of Comparative Example 3. It was found that the minimum melt viscosity of the underfill film of Comparative Example 3 was more than 15.0 Pa·S, hence the underfill film of Comparative Example 3 had insufficient flowability. Also, it was found that the minimum mounting pressure at the time of semiconductor mounting was more than 10.0 N, hence a high pressure was required for the semiconductor mounting. Also, the mounting body of Comparative Example 3 had a state of insufficient solder connection and insufficient solder wetting, and generation of a crack or a warp and generation of a void were observed.

TABLE 1

| | Blending Component | Example 1 | Example 2 | Example 3 | Example 4 | Example 5 | Comparative Example 1 | Comparative Example 2 | Comparative Example 3 |
|---|---|---|---|---|---|---|---|---|---|
| Film Forming Resin | MARUKA LYNCUR TB (PHS/EVE = 50/50) Mw = 20000, Mw/Mn = 1.8 (manufactured by Maruzen Petrochemical Co., Ltd.) | 70 | — | — | — | — | — | — | — |
| | MARUKA LYNCUR TB (PHS/EVE = 30/70) Mw = 20000, Mw/Mn = 1.8 (manufactured by Maruzen Petrochemical Co., Ltd.) | — | 70 | 100 | — | — | — | — | — |

TABLE 1-continued

| Blending Component | | Example 1 | Example 2 | Example 3 | Example 4 | Example 5 | Comparative Example 1 | Comparative Example 2 | Comparative Example 3 |
|---|---|---|---|---|---|---|---|---|---|
| | MARUKA LYNCUR TB (PHS/EVE = 70/30) Mw = 20000, Mw/Mn = 1.8 (manufactured by Maruzen Petrochemical Co., Ltd.) | — | — | — | 70 | — | — | — | — |
| | MARUKA LYNCUR TB (PHS/EVE = 20/80) Mw = 20000, Mw/Mn = 1.8 (manufactured by Maruzen Petrochemical Co., Ltd.) | — | — | — | — | 70 | — | — | — |
| | Phenotohto YP50 Mw = 50000, Mw/Mn = 3.5 (manufactured by Nippon Steel Chemical Co., Ltd.) | — | — | — | — | — | 70 | — | — |
| | Teisan Resin SG-P3 Mw = 850,000, Mw/Mn = 3.4 (manufactured by Nagase Chemtex Corporation) | — | — | — | — | — | — | 70 | — |
| | MARUKA LYNCUR TB (PHS/EVE = 50/50) Mw = 20000, Mw/Mn = 3.0 (manufactured by Maruzen Petrochemical Co., Ltd.) | — | — | — | — | — | — | — | 70 |
| Epoxy Resin | JER 1031S (manufactured by Mitsubishi Chemical Corporation) | 100 | 100 | 100 | 100 | 100 | 100 | 100 | 100 |
| Curing Agent | PHENOLITE TD2131 (manufactured by DIC Corporation) | — | — | — | — | — | 30 | 30 | — |
| | RIKACID DDSA (manufactured by New Japan Chemical Co., Ltd.) | 40 | 70 | 40 | 15 | 90 | 60 | 60 | 40 |
| Curing Catalyst | U-CAT 5002 (manufactured by San-Apro Ltd.) | 2 | 2 | 2 | 2 | 2 | 2 | 2 | 2 |
| Evaluation | Minimum Melt Viscosity (Pa · S) | <15.0 | <15.0 | <15.0 | <15.0 | <15.0 | >15.0 | >15.0 | >15.0 |
| | Minimum Mounting Pressure (N) | <10.0 | <10.0 | <10.0 | <10.0 | <10.0 | >10.0 | >10.0 | >10.0 |
| | Solder Connection State | ⊚ | ⊚ | ⊚ | ○ | ○ | X | X | X |
| | Presence and Absence of Crack or Warp | Absence | Absence | Absence | Absence | Absence | Presence | Presence | Presence |
| | Presence and Absence of Void | Absence | Absence | Absence | Absence | Absence | Presence | Presence | Presence |

From the results shown in Table 1, it was found that an underfill film comprising a film forming resin having a weight average molecular weight of 30000 g/mol and a molecular weight distribution of 2.0, an epoxy resin, and an epoxy curing agent had excellent flowability and was possible to be mounted at a low pressure.

Specifically, a film forming resin having a composition ratio of p-hydroxystyrene to ethyl vinyl ether (p-hydroxystyrene/ethyl vinyl ether) of not less than 20/80 and not more than 70/30 was used, and not less than 15 parts by mass and not more than 90 parts by mass of acid anhydride with respect to 100 parts by mass of epoxy resin were blended, whereby solder connection was in a good state, and generation of a crack or a warp and generation of a void were able to be prevented.

Furthermore, it was found that a film forming resin having a composition ratio of p-hydroxystyrene to ethyl vinyl ether (p-hydroxystyrene/ethyl vinyl ether) of not less than 30/70 and not more than 50/50 was used, and not less than 40 parts by mass and not more than 70 parts by mass of acid anhydride with respect to 100 parts by mass of epoxy resin were blended, whereby solder wetting was in a good state.

What is claimed is:

1. A method of manufacturing a semiconductor device comprising:
   a semiconductor chip mounting step configured to mount a semiconductor chip having a solder bump on a substrate via an underfill film including a film forming resin having a weight average molecular weight of not more than 30000 g/mol and a molecular weight distribution of not more than 2.0, an epoxy resin, and an epoxy curing agent, wherein the film forming resin is a tri-block copolymer of p-hydroxystyrene and ethyl vinyl ether; and
   a reflow step configured to solder-bond the above-mentioned semiconductor chip and the above-mentioned substrate by a reflow furnace.

2. An underfill material, comprising:
   a film forming resin having a weight average molecular weight of not more than 30000 g/mol, and a molecular weight distribution of not more than 2.0;
   an epoxy resin; and
   an epoxy curing agent;
   wherein the film forming resin is a tri-block copolymer of p-hydroxystyrene and ethyl vinyl ether.

3. The underfill material according to claim 2, wherein the epoxy curing agent is an acid anhydride.

4. The underfill material according to claim 2, wherein
a composition ratio of the p-hydroxystyrene to the ethyl vinyl ether (p-hydroxystyrene/ethyl vinyl ether) is not less than 20/80 and not more than 70/30, and
not less than 15 parts by mass and not more than 90 parts by mass of the epoxy curing agent with respect to 100 parts by mass of epoxy resin are blended.

5. The underfill material according to claim 2, wherein
a composition ratio of the p-hydroxystyrene to the ethyl vinyl ether (p-hydroxystyrene/ethyl vinyl ether) is not less than 30/70 and not more than 50/50, and
not less than 40 parts by mass and not more than 70 parts by mass of the epoxy curing agent with respect to 100 parts by mass of epoxy resin are blended.

* * * * *